United States Patent [19]

Kosaka

[11] Patent Number: 5,077,235
[45] Date of Patent: Dec. 31, 1991

[54] METHOD OF MANUFACTURING A SEMICONDUCTOR INTEGRATED CIRCUIT DEVICE HAVING SOI STRUCTURE

[75] Inventor: Daisuke Kosaka, Takarazuka, Japan

[73] Assignee: Ricoh Comany, Ltd., Tokyo, Japan

[21] Appl. No.: 466,059

[22] Filed: Jan. 16, 1990

[30] Foreign Application Priority Data

Jan. 24, 1989 [JP] Japan .................................. 1-15816

[51] Int. Cl.⁵ ................. H01L 21/205; H01L 21/268; H01L 21/76
[52] U.S. Cl. ...................................... 437/72; 437/173; 148/DIG. 152; 156/603
[58] Field of Search ................................ 437/173, 72; 148/DIG. 152; 156/603

[56] References Cited

U.S. PATENT DOCUMENTS

| | | | |
|---|---|---|---|
| 3,970,486 | 7/1976 | Kooj | 148/187 |
| 4,719,183 | 1/1988 | Maekawa | 437/84 |
| 4,822,752 | 4/1989 | Sugahara | 437/174 |

FOREIGN PATENT DOCUMENTS

| | | | |
|---|---|---|---|
| 0147041 | 9/1983 | Japan | 437/72 |
| 0175842 | 10/1983 | Japan | 437/72 |
| 0201326 | 11/1983 | Japan | 437/173 |
| 227423 | 9/1989 | Japan | 21/20 |
| 1227423 | 9/1989 | Japan | 156/603 |
| 1261291 | 10/1989 | Japan | 156/603 |

Primary Examiner—Olilk Chaudhuri
Assistant Examiner—Ourmaz S. Ojan
Attorney, Agent, or Firm—Cooper & Dunham

[57] ABSTRACT

A method of manufacturing a semiconductor integrated circuit device having a SOI structure includes the following steps. The first step is to form a semiconductor layer on a dielectric substrate. The second step is to form an oxide layer on the formed semiconductor layer. The third step is to form a nitride layer on the formed oxide layer. The fourth step is to remove a part of a plurality of layers composed of the semiconductor layer, the oxide layer, and a nitride layer so as to form a separated region in the layers. The fifth step is to coat a cooling agent on a surface of the nitride layer. The sixth step is to irradiate an energy beam from an outer surface of the cooling agent so as to monocrystallize the semiconductor layer. The seventh step is to remove the cooling agent from the surface of the nitride layer. And the final step is to oxidize a portion of the semiconductor layer located in the separated region by using the nitride layer. A semiconductor integrated circuit device having a SOI structure includes a semiconductor layer formed on a dielectric substrate, an oxide film formed on the semiconductor layer, a nitride layer formed on the oxide film, and a monocrystallized and oxidized semiconductor layer formed in hole portions formed in the semiconductor layer passing through the oxide layer and the nitride layer.

16 Claims, 3 Drawing Sheets

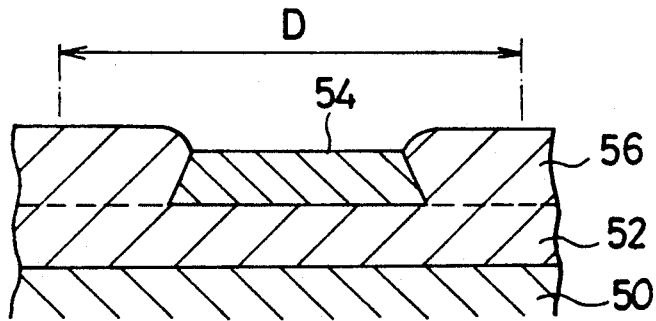
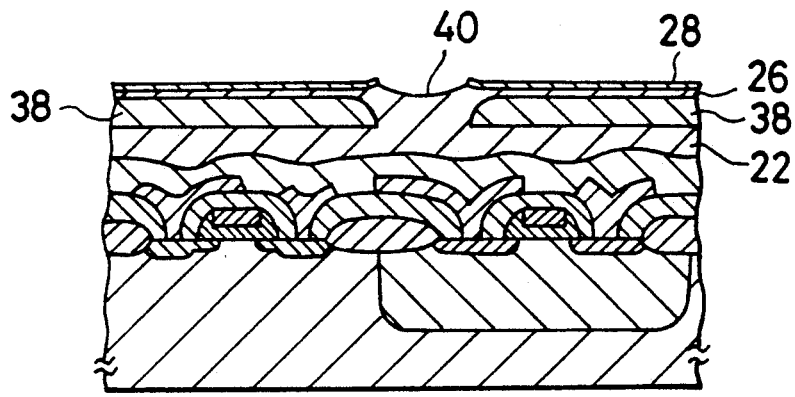
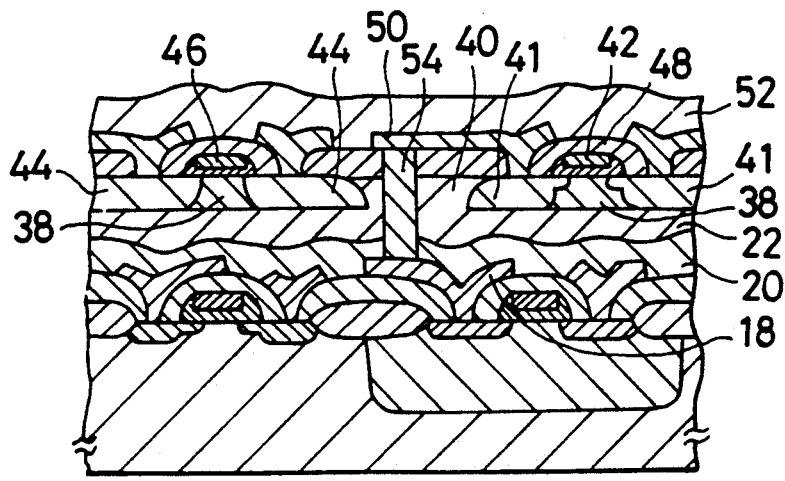

METHOD OF MANUFACTURING A SEMICONDUCTOR INTEGRATED CIRCUIT DEVICE HAVING SOI STRUCTURE

BACKGROUND OF THE INVENTION

1. Field of the Invention

The present invention relates to a method of manufacturing a semiconductor integrated circuit device having a SOI (silicon on insulator) structure in which electronic circuits are formed on a monocrystal semiconductor film laid on a dielectric member.

2. Description of the Related Art

Various methods of forming a monocrystallized semiconductor film having a SOI structure have been developed. However, formation of a monocrystallized film over a wide area is difficult in any of these methods. For example, when a polycrystalline silicon film formed on the entire surface of a dielectric member is recrystallized by using an energy beam such as a laser beam which irradiates the polycrystalline silicon film, a growth of the crystal grains proceeds from the periphery of the irradiated area to the center thereof, and a large number of nuclei thereof are formed and joined with each other, resulting in the inability to form a large monocrystal.

Several methods have been developed to form the islands of polycrystalline silicon on a $SiO_2$ film which is a dielectric film formed on a monocrystal silicon substrate. The islands of the polycrystlline silicon are separated by a $SiO_2$ layer for separation, as shown in FIG. 1. Each of the islands of the polycrystalline silicon has a dimension smaller than the diameter of a laser beam. Using the central portion of a Gaussian distributed laser beam and making the peripheral portion of each of the islands to be the heat absorbent layer, a monocrystal is grown by forming the different escape ways of the escape in absorbed heat in the heat absorbent layer.

In the method shown in FIG. 1, when the polycrystalline silicon layer has been monocrystallized, the islands of the monocrystal silicon separated by the $SiO_2$ layer are obtained. This enables electronic circuits to be formed on the monocrystal silicon layer in a separate fashion. This method therefore allows excellent compatibility with the semiconductor integrated circuit device manufacturing process. However, the islands of the polycrystalline silicon must be formed smaller than the diameter of a laser beam, and the problem arises in that a monocrystal having a large area can not be formed.

SUMMARY OF THE INVENTION

An object of the present invention is to provide a semiconductor integrated circuit device manufacturing method, including a monocrystallization process required for the formation of a SOI structure, which enables the islands of a monocrystal semiconductor separated by a dielectric member to be formed so as to improve the compatibility with the semiconductor integrated circuit device manufacturing process, and in which there is no limitation to the area of the semiconductor portions.

Another object of the present invention is to provide a semiconductor integrated circuit device having a monocrystallized SOI structure in which the islands of a monocrystal semiconductor separated by a dielectric member are formed and in which there is no limitation to the area of the semiconductor portions.

The object of the invention can be achieved by a method of manufacturing a semiconductor integrated circuit device having a SOI structure, comprising the steps of:

forming a polycrystalline or amorphous semiconductor layer on a dielectric member;

forming an oxide layer on the formed semiconductor layer;

forming a nitride layer on the formed oxide layer;

removing a part of a plurality of layers composed of said semiconductor layer, the oxide layer and the nitride layer so as to form a separated region in the layers;

coating a cooling medium on a surface of the nitride layer;

irradiating energy beam from an outer side of the cooling medium so as to monocrystallize said semiconductor layer;

removing the cooling medium from the surface of the nitride layer; and oxidizing a portion of the semiconductor layer located in the separated region using the nitride layer. Preferably, the separated region is formed by a photoengraving process and an etching process. Preferably, the cooling medium coated on the surface of the nitride layer is polyethylene glycol. Preferably, semiconductor film has a thickness of about 3000 Å, the oxide film has a thickness of about 1000 Å, the nitride film has a thickness of about 1000 Å, and the separating area has a thickness ranging from about 1000 Å to about 1500 Å.

Advantages of the above-mentioned method are as follows. The islands of the monocrystal semiconductor separated by the $SiO_2$ layer are formed, and complete compatibility with the normal MOS process is attained, and a mono crystal semiconductor film having a good quality can be formed by adjusting the thickness of the silicon oxide film formed on the polycrystalline or amorphous semiconductor layer.

The another object can be achieved by a semiconductor integrated circuit device having a SOI structure, comprising:

a dielectric member;

a semiconductor layer formed on the dielectric member;

an oxide film formed on the semiconductor layer;

a nitride layer formed on said oxide film; and a monocrystallized and oxidized semiconductor layer formed in hole portions formed in the semiconductor layer passing through the oxide layer and the nitride layer.

Advantages of the above-mentioned device are as follows. The device having a monocrystallized SOI structure in which the islands of a monocrystal semiconductor without any limitation of the area there can be provided.

Further objects and advantages of the present invention will be apparent from the following description, reference being had to the accompanying drawings wherein preferred embodiments of the present invention are clearly shown.

BRIEF DESCRIPTION OF THE DRAWINGS

FIG. 1 is a cross-sectional view of a semiconductor device having a SOI structure which is manufactured by a process in a related art;

FIG. 3 is a cross-sectional view of a semiconductor circuit device having a SOI structure which is manufactured by the manufacturing method according to the present invention; and FIG. 4 is a cross-sectional view of a semiconductor circuit device having a SOI structure to which the manufacturing method according to the present invention is applied.

DETAILED DESCRIPTION OF THE PREFERRED EMBODIMENT

An embodiment of a semiconductor integrated circuit device manufacturing method according to the present invention will be described below with reference to FIGS. 2A to 2D.

Figure 2A:
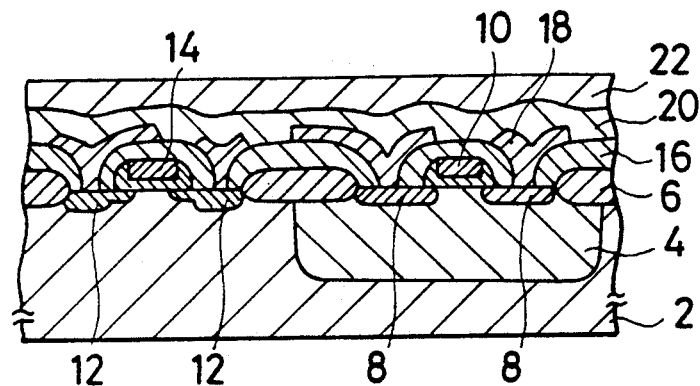
FIGS. 2A to 2D illustrate the processes of a method of manufacturing a semiconductor circuit device having a SOI structure according to the present invention.

FIG. 2A shows a semiconductor device on which normal wafer processes up to the metallization process have been conducted. In the semiconductor device shown in FIG. 2A, a P-type channel MOS transistor is formed on the right, while an N-type channel MOS transistor is formed on the left.

A P-type silicon substrate 2 and an N-type well area 4 are separated from each other b field oxide films 6. A source and a drain are formed by P-type diffused layers 8 on the N-type well area 4. A gate electrode 10 composed of a polycrystalline silicon layer is formed on a gate oxide film laid on a channel regions. A source and a drain are formed by N-type diffused layers 12 which respectively form on the P-type silicon substrate 2. A gate electrode 14 composed of a polycrystalline silicon layer is formed on a gate oxide film laid on a channel regions.

Wirings 18 composed of a metal having a high melting point, such as tungsten, or of a metal silicide having a high melting point, pass through contact-holes formed in PSG films 16 and are connected to the sources and the drains, respectively.

Figure 2B:
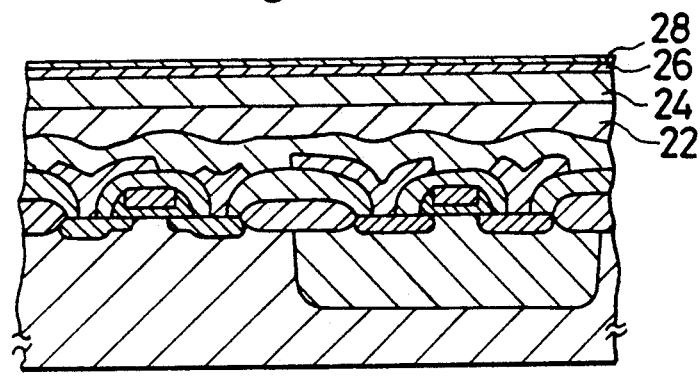
Figure 2C:
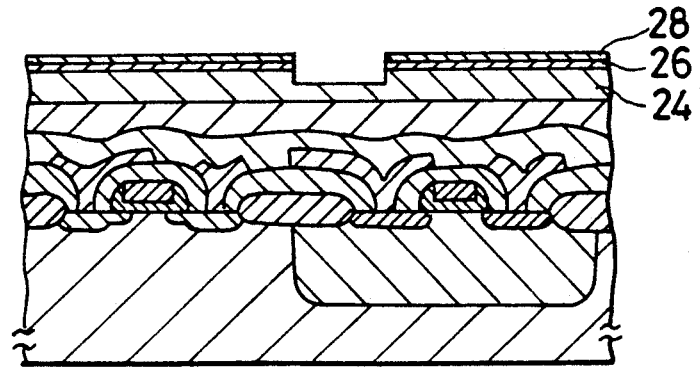
Figure 2D:
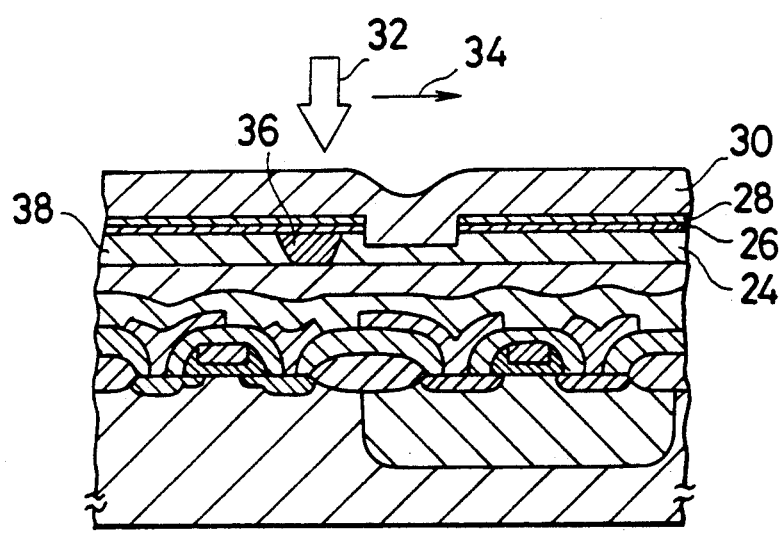

Dielectric films 20 and 22 are formed with a thickness of 1 μm or above as insulating films on the wirings 18. The dielectric films 20 and 22 have a flat surface which is flattened by, for example, an etchback process. In this etchback process, the surface of the dielectric film 22 is flattened by coating an organic film such as a resist on the dielectric film 22 with a thickness which ensures that the surface of the dielectric film 22 is made flat and then by etching back the overall surface under the condition in which an etch rate of the dielectric film 22 is equal to that of the organic film. Next, a polycrystalline silicon layer 24 with a thickness of about 3000 Å is deposited on the dielectric film 22 by the LPCVD method, a silicon oxide film 26 with a thickness of about 1000 Å is formed on the polycrystalline silicon layer 24 by the LPCVD method, and a silicon nitride film 28 with a thickness of about 1000 Å is then formed on the silicon oxide film 26 by the LPCVD method, as shown in FIG. 2B. After the completion of the previous process, an etching is performed by using a photoengraving process and an etching process so as to form an etching on a separated region, as shown in FIG. 2C. In this etching process, the silicon nitride film 28 and the silicon oxide film 26 in the separated region, and a part of the polycrystalline silicon layer 24 are removed respectively, and the polycrystalline silicon layer 24 with a thickness ranging from 1000 Å to 1500 Å is thereby left. Subsequently, a polyethylene glycol film 30 is formed on the surface as a cooling medium, and an energy beam such as an argon laser 32 is irradiated from the side of the surface of the wafer on the polycrystalline silicon layer 24 through the polyethylene glycol film 30, the silicon nitride film 28, and the silicon oxide film 26, as shown in FIG. 2D. The output of the argon laser 32 may be set to 3 watts or above. As the argon laser 32 is scanned across the wafer in the direction indicated by the arrow 34, a melted portion 36 of the polycrystalline silicon layer 24 is moved, thus forming a monocrystal silicon layer 38. Then, as shown in FIG. 3, the polyethylene glycol layer 30 is removed, and oxidation is performed. This oxidation process is performed in the same manner as that in which a field oxide film is formed in the MOS process. The oxidation process may be performed in an atmosphere of, for example, $HCl/H_2/O_2$ or at an atmosphere dry $O_2$ at a temperature ranging from 900° to 950° C. In this oxidation process, the separated region is selectively oxidized due to the presence of the silicon nitride film 28 on the regions other than the separated region, thereby a $SiO_2$ layer 40 is formed on the separated region. As a result, the monocrystal silicon layer 38 is separated by the $SiO_2$ layer 40.

After the silicon nitride film 28 and the silicon oxide film 26 have been removed, a device, such as a MOS transistor, is formed by a normal wafer process. For example, an N-type channel MOS transistor is formed on the right area having the SOI structure, and a P-type channel MOS transistor is formed on the left. N-type diffused areas 41 are formed as the source and the drain of the N-type channel MOS transistor, and a polycrystalline silicon layer 42 is formed on the channel area as a gate electrode. P-type diffused areas 44 are formed as the source and the drain of the P-type channel MOS transistor, and a polycrystalline silicon layer is formed on the channel area as a gate electrode 46. Reference numerals 48, 50, and 52 denote a PSG film, a metal wiring, and a passivation film respectively. A through-hole is formed in the PSG film 48, the $SiO_2$ layer 40 and the insulating films 22 and 20, and a tungsten layer formed by the CVD method is buried in the through-hole so as to connect the drain of the P-type channel MOS transistor piled in the lower portion to the drain of the N-type channel MOS transistor piled in the upper portion and thereby construct a CMOS.

In the present invention, a polycrystalline or amorphous semiconductor layer is formed on a dielectric member, and an oxide film and a nitride layer are formed on the polycrystalline or amorphous semiconductor layer in that order. Thereafter, the nitride film and the oxide film of the separated region, and a part of the semiconductor layer are removed so as to form a separated area, and the cooling medium layer is then coated on these layers. Subsequently, an energy beam is irradiated on the semiconductor layer so as to monocrystallize the semiconductor layer, and the cooling medium is then removed. After the semiconductor layer located in the separated region has been oxidized with the nitride layer acting as a mask, electronic circuits are formed on the monocrystal semiconductor layer. In consequence, the islands of the monocrystal semiconductor separated by the $SiO_2$ layer are formed, and complete compatibility with the normal MOS process is attained.

In the monocrystallization process carried out in the present invention, a monocrystal semiconductor film having a good quality can be formed by adjusting the thickness of the silicon oxide film formed on the polycrystalline or amorphous semiconductor layer.

An amorphous silicon layer may be used in place of the polycrystalline silicon layer.

Various surface-active agents, such as polyethylene glycol, polyethylene ether, polyethylene ester, and polypropylene oxide, may be employed as the cooling medium.

Examples of energy beam include a laser beam, other types of optical beams, an electron beam and heat rays.

Many widely different embodiments of the present invention may be constructed without departing from the spirit and scope of the present invention. It should be understood that the present invention is not limited to the specific embodiments described in this specification, except as defined in the appended claims.

What is claimed is:

1. A method of manufacturing a semiconductor integrated circuit device having a SOI structure, comprising the steps of:
    forming a non-monocrystalline semiconductor layer on a dielectric member;
    forming an oxide layer on said formed semiconductor layer;
    forming a nitride layer on said formed oxide layer;
    removing a part of a plurality of layers composed of said semiconductor layer, said oxide layer and said nitride layer so as to form a separated region in said layers;
    coating a surface active agent as cooling medium on a surface of said nitride layer;
    irradiating energy beam from an outer side of said coated surface active agent with an energy beam so as to mono-crystallize said semiconductor layer;
    removing said coated surface active agent from said surface of said nitride layer; and
    oxidizing a portion of said semiconductor layer located in said separated region using said nitride layer.

2. The method of manufacturing a semiconductor integrated circuit having a SOI structure according to claim 1, wherein said non-monocrystalline semiconductor is made of polycrystalline semiconductor.

3. The method of manufacturing a semiconductor integrated circuit having a SOI structure according to claim 1, wherein said non-monocrystalline semiconductor is made of an amorphous semiconductor.

4. The method of manufacturing a semiconductor integrated circuit having a SOI structure according to claim 1, wherein said separated region is formed by a photoengraving process and an etching process.

5. The method of manufacturing a semiconductor integrated circuit having a SOI structure according to claim 1, wherein said surface active agent coated on said surface of said nitride layer is polyethylene glycol.

6. The method of manufacturing a semiconductor integrated circuit having a SOI structure according to claim 1, wherein said non-monocrystalline semiconductor film has a thickness of about 3000 Å.

7. The method of manufacturing a semiconductor integrated circuit having a SOI structure according to claim 1, wherein said oxide film has a thickness of about 1000 Å.

8. The method of manufacturing a semiconductor integrated circuit having a SOI structure according to claim 1, wherein said nitride film has a thickness of about 1000 Å.

9. The method of manufacturing a semiconductor integrated circuit having a SOI structure according to claim 1, wherein said separating area has a thickness ranging from about 1000 Å to about 1500 Å.

10. The method of manufacturing a semiconductor integrated circuit having a SOI structure according to claim 1, wherein said surface active agent is polyethylene ether.

11. The method of manufacturing a semiconductor integrated circuit having a SOI structure according to claim 1, wherein said surface active agent is polyethylene ester.

12. The method of manufacturing a semiconductor integrated circuit having a SOI structure according to claim 1, wherein said surface active agent is polypropylene oxide.

13. The method of manufacturing a semiconductor integrated circuit having a SOI structure according to claim 1, wherein said energy beam is a laser beam.

14. The method of manufacturing a semiconductor integrated circuit having a SOI structure according to claim 1, wherein said energy beam is an optical beam other than a laser beam.

15. The method of manufacturing a semiconductor integrated circuit having a SOI structure according to claim 1, wherein said energy beam is an electron beam.

16. The method of manufacturing a semiconductor integrated circuit having a SOI structure according to claim 1, wherein said energy beam is heat rays.

* * * * *